US006638690B1

(12) United States Patent
Meier et al.

(10) Patent No.: US 6,638,690 B1
(45) Date of Patent: Oct. 28, 2003

(54) METHOD FOR PRODUCING MULTI-LAYER CIRCUITS

(75) Inventors: Kurt Meier, Therwil (CH); Norbert Münzel, Heitersheim (DE)

(73) Assignee: Vantico, Inc., Brewster, NY (US)

( * ) Notice: Subject to any disclaimer, the term of this patent is extended or adjusted under 35 U.S.C. 154(b) by 0 days.

(21) Appl. No.: 09/787,221

(22) PCT Filed: Sep. 9, 1999

(86) PCT No.: PCT/EP99/06630

§ 371 (c)(1),
(2), (4) Date: Mar. 16, 2001

(87) PCT Pub. No.: WO00/18201

PCT Pub. Date: Mar. 30, 2000

(30) Foreign Application Priority Data

Sep. 18, 1998 (CH) .............................................. 1911/98

(51) Int. Cl.$^7$ .............................. G03C 5/00; G03F 7/00; H05K 7/00
(52) U.S. Cl. ...................... 430/313; 430/318; 430/319; 174/250
(58) Field of Search ................................ 430/311, 312, 430/313, 318, 319; 174/250

(56) References Cited

U.S. PATENT DOCUMENTS

| | | | | |
|---|---|---|---|---|
| 4,780,957 A | * | 11/1988 | Shiga et al. ................ | 174/266 |
| 5,451,721 A | | 9/1995 | Tsukada et al. ............ | 174/261 |
| 5,476,748 A | | 12/1995 | Steinmann et al. ......... | 430/269 |
| 5,532,105 A | * | 7/1996 | Yamadera et al. .......... | 430/311 |
| 5,945,258 A | * | 8/1999 | Shimizu et al. ............. | 216/17 |

FOREIGN PATENT DOCUMENTS

DE          3840207 A1         5/1990

OTHER PUBLICATIONS

Y. Tsukada et al., "Surface laminar Circuit Packaging" XP 000473962, pub. May 18, 1992, pp. 22–27.

* cited by examiner

*Primary Examiner*—Mark F. Huff
*Assistant Examiner*—Kripa Sagar
(74) *Attorney, Agent, or Firm*—Proskauer Rose LLP

(57) ABSTRACT

The invention relates to a method for producing sequentially built-up printed circuit boards having a disparate number of conduction planes on both sides of the laminate core, which method comprises the following method steps:

(A) coating both sides of a printed circuit board having conductor structures on only one side with a dielectric comprising a photopolymer or a thermally curable polymer;

(B) structuring the plating holes (vias) on the side having the conductor structures by exposing the dielectric comprising a photopolymer to light and then developing with a solvent or by laser-drilling the plating holes (vias) into the dielectric comprising a thermally cured polymer;

(C) depositing a copper layer on both sides of the board so obtained;

(D) forming conductor structures on the front and completely etching away on the rear, if further asymmetric build-up is to be carried out, or on both sides of the printed circuit board if there is to be no further build-up or if further build-up is to be carried out symmetrically, by means of selective etching with the aid of resists;

(E) repetition of process steps (A) to (D) if further asymmetric build-up is to be carried out or (A) and subsequent structuring (F) of the dielectric layer on both sides followed by (C) and (D) if further build-up is to be carried out symmetrically.

6 Claims, 1 Drawing Sheet

METHOD FOR PRODUCING MULTI-LAYER CIRCUITS

The present invention relates to a method for producing multi-layer printed circuit boards.

Multi-layer printed circuit boards having a high wiring density have, in recent times, been advantageously produced by the so-called SBU ("sequential build-up") method. The electrical connection between the individual conductors ("through-platings") is customarily produced by means of drilled holes, which pass through the conductor planes and are metal-plated. The mechanically drilled holes are, however, relatively large (minimum diameter about 0.3 mm) and limit the wiring density of the printed circuit board. DE-A 38 40 207 describes a method for producing multi-layer printed circuit boards wherein through-platings of small diameter are produced photochemically with the aid of photoresist materials.

U.S. Pat. No. 5,451,721 also proposes an SBU method wherein through-platings are first established between the individual conductor planes using photoresists. Then, a conductive connection is produced between the outermost wiring layers by means of mechanically drilled and metal-plated through-holes. In the printed circuit board so produced, the two outer wiring layers are used for power supply lines whereas the signal wiring lines are located in the interior of the laminate.

The method described in U.S. Pat. No. 5,451,721 is, however, of only limited suitability for producing printed circuit boards having a disparate number of wiring layers on both sides of the laminate core because, in the case of the arrangement built up asymmetrically, a high degree of curvature is to be expected, especially when laminate cores less than 0.8 mm thick are used, caused by polymerisation shrinkage of the dielectric layer applied to only one side. In addition, copper-plating the copper layer on the rear one or more times results in disparate copper thicknesses on both sides of the board. The subsequent etching customarily carried out simultaneously on both sides results in over-etching of the upper, thinner copper layer.

The aim of the invention was to develop a method for producing sequentially built-up printed circuit boards having a disparate number of conduction planes on both sides of the laminate core that does not have the above-mentioned disadvantages.

It has now been found that satisfactory results are obtained by starting from a laminate core that has conductor structures on only one side, coating that core on both sides with a dielectric, but structuring only one side and fully curing the other side.

The present invention accordingly relates to a method for producing sequentially built-up printed circuit boards having a disparate number of conduction planes on both sides of the laminate core, which method comprises the following method steps:

(A) coating both sides of a printed circuit board having conductor structures on only one side with a dielectric comprising a photopolymer or a thermally curable polymer;

(B) structuring the plating holes (vias) on the side having the conductor structures by exposing the dielectric comprising a photopolymer to light and then developing with a solvent or by laser-drilling the plating holes (vias) into the dielectric comprising a thermally cured polymer;

(C) depositing a copper layer on both sides of the board so obtained;

(D) forming conductor structures on the front and completely etching away on the rear, if further asymmetric build-up is to be carried out, or on both sides of the printed circuit board if there is to be no further build-up or if further build-up is to be carried out symmetrically, by means of selective etching with the aid of resists;

(E) repetition of process steps (A) to (D) if further asymmetric build-up is to be carried out or (A) and subsequent structuring (F) of the dielectric layer on both sides followed by (C) and (D) if further build-up is to be carried out symmetrically.

The invention is illustrated by the accompanying drawings.

Figure 1:
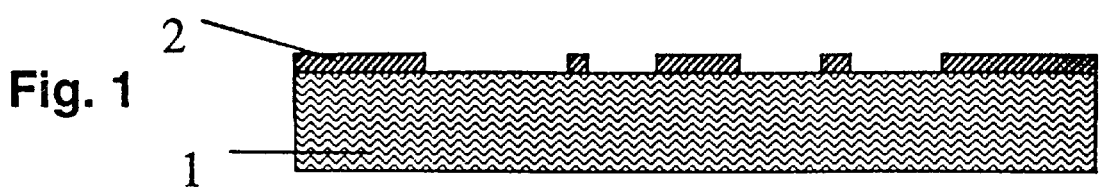
FIGS. 1–5 depict the various stages of the process of this invention.
Figure 2:
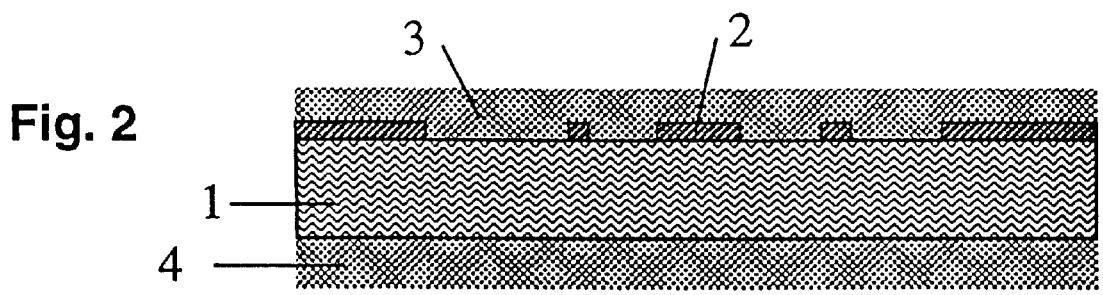

FIG. 1 shows an insulating substrate (1), preferably a glass-fibre-reinforced epoxy resin, which has conductor structures (2) on only one side. In method step (A), both sides of the single-sided printed circuit board are coated with a dielectric curable material (3 and 4, FIG. 2).

Coating is performed by the customary methods, for example by spin-coating, immersion, knife coating, curtain pouring, screen-printing, brush application, spraying, electrostatic spraying or reverse roller coating.

The printed circuit board is preferably coated by means of curtain pouring or screen-printing.

The dielectric material may be applied in the form of a solution or also in the form of a dry film. When a solution is used, the solvent is subsequently removed by drying. The dielectric coating thickness must be greater than the height of the copper conductor tracks of the printed circuit board. The dry coating is advantageously about from 20 to 150 $\mu$m thick, preferably from 30 to 80 $\mu$m thick.

A photopolymer (photo-via process) or a thermally curable polymer (laser-via process) may be used as the dielectric material.

In the photo-via process, positive photoresists or negative photoresists may be used. Suitable photoresist materials will be known to the person skilled in the art. Examples thereof are the positive photoresists described in EP-A 689 098 and the negative photoresists known from EP-A 605 361.

The printed circuit board used in method step (A) may already be a conventional multilayer circuit wherein the through-plating holes have not yet been drilled or wherein the drilled through-plating holes have been closed using a resin.

Figure 3:
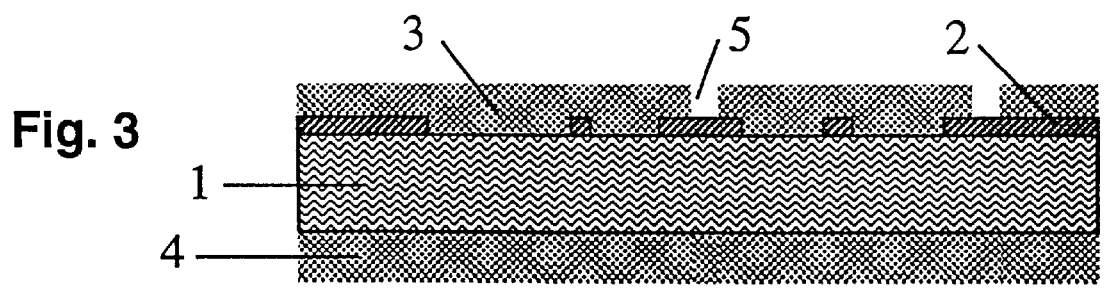

In method step (B) (FIG. 3), the dielectric on the side having the conductor structures is removed, by means of image-producing methods, at the locations (5) intended for the through-plating holes.

In the photo-via process, the photoresist coating is exposed to light through a mask corresponding to the conductor structure to be applied and is developed. In order to achieve complete crosslinking, it is advisable for thermal after-curing to be carried out after method step (B).

When a negative photo-via dielectric is used, full-area exposure of both sides to light is additionally carried out preferably before or after thermal after-curing.

On the rear of the printed circuit board, the dielectric material which has not undergone prior structuring is fully cured over the entire area.

In the case of a negative photoresist this is carried out by full-area exposure to light and, where appropriate, thermal after-curing. In the case of a positive photoresist the rear of the printed circuit board is subjected to full-area full thermal curing without prior exposure to light.

If no additional conduction planes are required and through-platings have not yet been provided between the front and rear of the printed circuit board, the through-platings may be prepared by means of drilled holes after method step (B) has been carried out.

Figure 4:
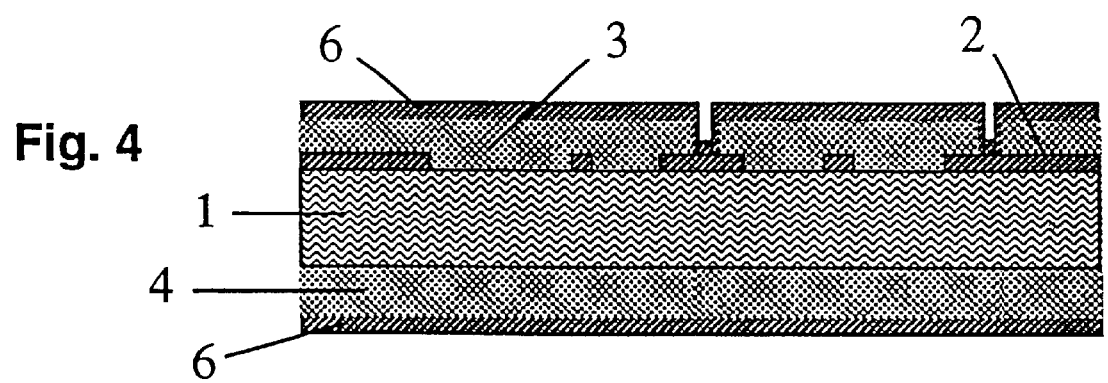

The printed circuit board so obtained is roughened on both sides by etching in accordance with known methods (for example, using aqueous $KMnO_4$ solution). The entire surface is then chemically copper-plated (FIG. 4), i.e. a thin copper layer (6) is applied by currentless plating. Where appropriate, subsequent drying is carried out and the copper layer is thickened by electrodeposition.

Figure 5:
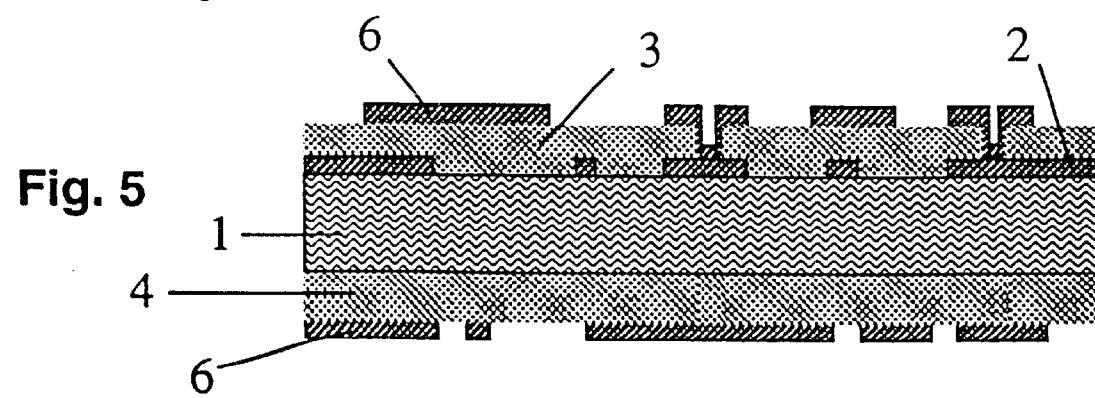

In method step (D), the copper layer is then structured on both sides by selective etching (FIG. 5), generally by coating both sides of the printed circuit board with an etching resist, exposing to light imagewise, developing, and removing the uncovered copper. This may be carried out in an etching process ("panel plating process") or in the electrodeposition process ("pattern plating process").

If additional conductor planes are required, method steps (A) to (D) may be repeated as often as desired.

What is claimed is:

1. A method for producing sequentially built-up printed circuit boards having a disparate number of conduction planes on a first side of a laminate core than on a second side of the laminate core, the method comprising the steps of:

(A) coating the first and second sides of a printed circuit board having conductor structures on only the first side with a dielectric comprising a photopolymer or a thermally curable polymer;

(B) structuring vias on the first side by exposing the dielectric comprising a photopolymer to light and then developing with a solvent or by laser-drilling the vias into the dielectric comprising a thermally cured polymer;

(C) depositing a copper layer on both sides of the board;

(D) forming conductor structures on the first side and completely etching away copper on the second side, if further asymmetric build-up is to be carried out, or on the first side and the second side if there is to be no further build-up or if further build-up is to be carried out symmetrically, by means of selective etching with the aid of resists;

(E) repetition of steps (A) to (D) if further asymmetric build-up is to be carried out or step (A) followed by structuring of the dielectric layer on the first side and the second side followed by steps (C) and (D) if further build-up is to be carried out symmetrically.

2. A method according to claim 1, wherein in method step (A) the printed circuit board is coated by means of curtain pouring or screen-printing.

3. A method according to claim 1, wherein in the photo-via process, after method step (B), thermal after-curing is carried out for completely crosslinking the polymer.

4. A method according to claim 3, wherein, when a negative photo-via dielectric is used, full-area exposure of both sides to light is carried out after method step (B), before or after thermal after-curing for completely crosslinking the polymer.

5. A method according to claim 1, wherein in method step (C) the board is first roughened and then chemically copper-plated and subsequently copper-plated by electrodeposition.

6. A method according to claim 1, wherein through-holes are drilled into the printed circuit board after method step (B).

* * * * *